(12) United States Patent
Yamada et al.

(10) Patent No.: US 9,006,861 B2
(45) Date of Patent: Apr. 14, 2015

(54) INTEGRATED CIRCUIT DEVICE

(71) Applicant: Kabushiki Kaisha Toshiba, Tokyo (JP)

(72) Inventors: Kenji Yamada, Kanagawa (JP); Hideki Kimijima, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/973,250

(22) Filed: Aug. 22, 2013

(65) Prior Publication Data

US 2014/0246704 A1    Sep. 4, 2014

(30) Foreign Application Priority Data

Mar. 1, 2013  (JP) .................. 2013-041288

(51) Int. Cl.
*H01L 27/02*    (2006.01)
(52) U.S. Cl.
CPC .................. *H01L 27/0248* (2013.01)

(58) Field of Classification Search
USPC ................ 257/209, 529; 438/132, 601
See application file for complete search history.

(56) References Cited

U.S. PATENT DOCUMENTS 6,111,301 A * 8/2000 Stamper .................. 257/529

FOREIGN PATENT DOCUMENTS

| JP | 2002076129 A | 3/2002 | |
| JP | 2002076129 A * | 3/2002 | .......... H01L 21/3205 |
| JP | 2006-059969 | 3/2006 | |
| JP | 2008-288417 | 11/2008 | |
| JP | 2011-054701 | 3/2011 | |

* cited by examiner

*Primary Examiner* — Daniel Shook
(74) *Attorney, Agent, or Firm* — Patterson & Sheridan, LLP

(57) ABSTRACT

An integrated circuit device includes a fuse in which a pair of terminal portions connected to different conductive components is provided on both sides of a cuttable portion that is cut as needed by being irradiated with laser light, the cuttable portion and the pair of terminal portions being integrally formed. The cuttable portion may be thinner than the terminal portions.

19 Claims, 8 Drawing Sheets

EXAMPLE 1
THICKNESS OF CUT PORTION: THIN
VOLUME RATIO: 20.7
CRACK: NONE

```
EXAMPLE 2
THICKNESS OF CUT PORTION: SAME
VOLUME RATIO: 20.4
CRACK: NONE
```

```
EXAMPLE 3
THICKNESS OF CUT PORTION: SAME
VOLUME RATIO: 20.8
CRACK: NONE
```

COMPARATIVE EXAMPLE 1
THICKNESS OF CUT PORTION: SAME
VOLUME RATIO: 3.5
CRACK: PRESENT

COMPARATIVE EXAMPLE 2
THICKNESS OF CUT PORTION: SAME
VOLUME RATIO: 4.4
CRACK: PRESENT

INTEGRATED CIRCUIT DEVICE

CROSS-REFERENCE TO RELATED APPLICATION

This application is based upon and claims the benefit of priority from Japanese Patent Application No. 2013-041288, filed Mar. 1, 2013, the entire contents of which are incorporated herein by reference.

FIELD

Embodiments described herein relate generally to integrated circuit devices.

BACKGROUND

In an integrated circuit device, a fuse is sometimes provided to isolate selected wiring lines as appropriate during or after a production process. To isolate the selected wiring, the fuse is cut as needed by being irradiated with laser light. However, when the fuse is cut by the laser light, a crack sometimes appears in the base insulating film over which the fuse is formed. This may cause the integrated circuit device to malfunction.

DETAILED DESCRIPTION

Embodiments provide an integrated circuit device in which little damage is caused to an underlying or adjacent base when a fuse therein is cut by being irradiated with laser light.

An integrated circuit device of an embodiment includes a fuse in which a pair of terminal portions connected to different conductive components, is provided on both sides of a cuttable portion that maybe cut as needed by being irradiated with laser light, the cuttable portion and the pair of terminal portions being integrally formed. The cuttable portion is thinner than, at least in one dimension, the terminal portions between which it spans.

An integrated circuit device of an embodiment includes a fuse in which a pair of terminal portions connected to different conductive components is provided on both sides of a cuttable portion that is cut as needed by being irradiated with laser light, the cuttable portion and the pair of terminal portions being integrally formed. The total volume of the pair of terminal portions is 20 or more times the volume of the cut portion.

Hereinafter, exemplary embodiments will be described with reference to the drawings.

First, a first embodiment will be described.

Figure 1A:
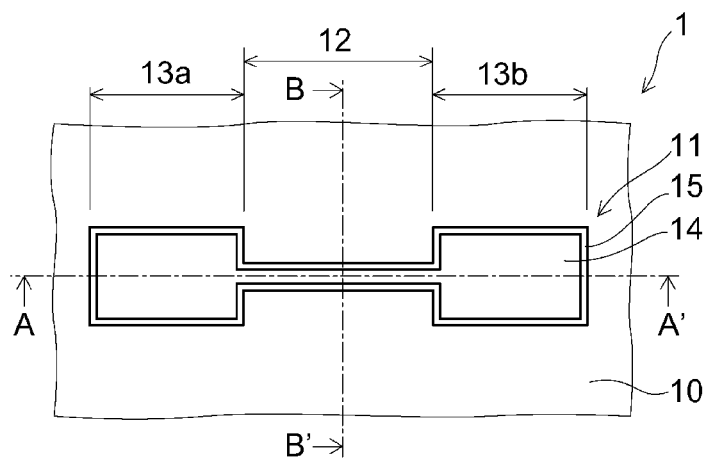
FIG. 1A is a plan view illustrating an integrated circuit device according to a first embodiment.
Figure 1B:
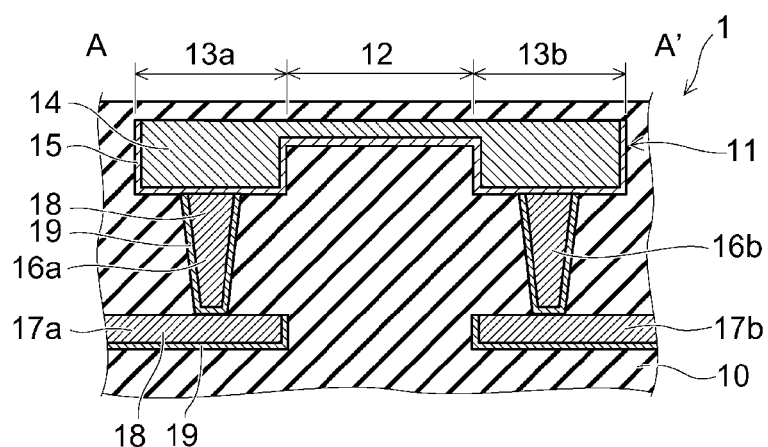
FIG. 1B is a sectional view taken on the line A-A' shown in FIG. 1A.

FIG. 1A is a plan view illustrating an integrated circuit device according to this embodiment by way of an example. FIG. 1B is a sectional view taken on the line A-A' of FIG. 1A, and FIG. 1C is a sectional view taken on the line B-B' of in FIG. 1A.

Figure 1C:
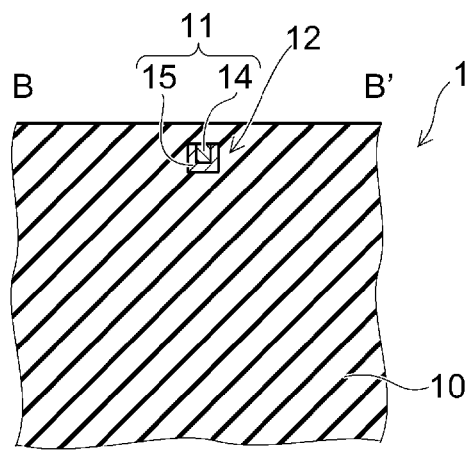
FIG. 1C is a sectional view taken on the line B-B' shown in FIG. 1A.

As shown in FIGS. 1A to 1C, in an integrated circuit device 1 according to this embodiment, an interlayer dielectric 10 made of silicon oxide ($SiO_2$), for example, is provided on a silicon substrate (not shown), and a fuse 11 structure is embedded in the interlayer dielectric 10. The fuse 11 is a wiring component forming part of a circuit of the integrated circuit device 1 and is a portion of a wiring circuit thereof which may be intentionally cut by laser light when the connection state of the circuit has to be changed during or after a production process of the integrated circuit device 1. The fuse 11 can be used, for example, in a redundancy circuit of a memory, a trimming portion for tuning the characteristics of an analog circuit, or a Field-Programmable Gate Array (FPGA).

In the fuse 11, a cuttable portion 12, in the form of a wiring line, is disposed between and physically and electrically interconnects a pair of pad-shaped terminal portions 13a and 13b disposed on either side of the cuttable portion 12 in the direction of the length thereof. The cuttable portion 12 is a portion which may be irradiated with laser light for cutting or "opening" the fuse 11, and is vaporized such that a portion of the material thereof is physically removed when irradiated with the laser light. The terminal portions 13a and 13b are each connected to a corresponding one of the opposed ends of the cuttable portion 12 in the direction of the length thereof.

The cuttable portion 12, the terminal portion 13a, and the terminal portion 13b have the shape of a substantially rectangular parallelepiped, i.e., they are generally rectangular in cross section. The shape and the size of the terminal portion 13a is, in this embodiment, the same as the shape and the size of the terminal portion 13b. The cuttable portion 12 is thinner than the terminal portions 13a and 13b. Moreover, the width of the terminal portions 13a and 13b is greater than the width of the cut portion 12. Thus, the cross section of the cuttable portion 12 is smaller than that of either terminal portion 14. In addition, the total volume of the terminal portions 13a and 13b is 20 or more times the volume of the cuttable portion 12.

The cuttable portion 12 and the terminal portions 13a and 13b are integrally formed. That is, in the fuse 11, a main body portion 14 made of copper (Cu), for example, and a barrier metal layer 15 that is made of tungsten nitride (WN), for example, are provided and they cover a lower surface and a side surface of the main body portion 14. The barrier metal layer 15 is not disposed in the boundary (interconnection location) of the cuttable portion 12 and the terminal portions 13a and 13b.

In the integrated circuit device 1, a pair of vias 16a and 16b and wiring lines 17a and 17b are further provided and are embedded in the interlayer dielectric 10. The vias 16a and 16b are disposed immediately below the terminal portions 13a and 13b, an upper end of the via 16a is connected to a lower surface of the terminal portion 13a, and an upper end of the via 16b is connected to a lower surface of the terminal portion 13b. Moreover, a lower end of the via 16a is connected to an upper surface of the wiring line 17a, and a lower end of the via 16b is connected to an upper surface of the wiring line 17b. As a result, the terminal portion 13a is connected, via the via 16a and the wiring line 17a, to the other portion of the integrated circuit device 1, for example, one node in a circuit that determines whether the fuse 11 is to remain conducting or needs to be disconnected, and the terminal portion 13b is connected to the other node in the same circuit via the via 16b and the wiring line 17b.

Also in the vias 16a and 16b and the wiring lines 17a and 17b, a main body portion 18 made of copper, for example, and a barrier metal layer 19 that is made of tungsten nitride, for example, which covers a lower surface and a side surface of the main body portion 18, are provided. Between the main body portion 14 of the fuse 11 and the vias 16a and 16b, the barrier metal layer 15 of the fuse 11 is interposed. Therefore, the boundary of the fuse 11 and the vias 16a and 16b can be defined by using the barrier metal layer 15 as an indicator of the profile thereof. However, when the vias 16a and 16b and the fuse 11 are formed concurrently by a dual damascene fabrication process, for example, the barrier metal layer 15 is not interposed between the main body portion 14 of the fuse 11 and the vias 16a and 16b. In this case, the boundary of the fuse 11 and the vias 16a and 16b can be defined by the outer surfaces of the terminal portions 13a and 13b and the cuttable portion 12 as a single rectangular parallelepiped.

Such a fuse 11 can be formed by the damascene process involving two operations of lithography, for example. That is, the interlayer dielectric 10, the wiring lines 17a and 17b, and the vias 16a and 16b are formed on a silicon substrate (not shown). Next, by a first operation of lithography, relatively deep grooves for forming the terminal portions 13a and 13b are formed in the upper surface of the interlayer dielectric 10. On the bottom surfaces of these grooves, the upper surfaces of the vias 16a and 16b are exposed. Next, by a second operation of lithography, a relatively shallow groove for forming the cuttable portion 12 is formed in the upper surface of the interlayer dielectric 10. This groove is made to communicate with the grooves for forming the terminal portions described above. Then, the barrier metal layer 15 is formed on an inner surface of these grooves. Next, by depositing copper therein and planarizing the upper surface thereof, the main body portion 14 of the fuse 11 is formed. In this manner, the fuse 11 in which the cuttable portion 12 is thinner than the terminal portions 13a and 13b can be formed having an integrally formed conductive material therein, such as the copper.

Next, a method for cutting the fuse in this embodiment will be described.

Figure 2A:
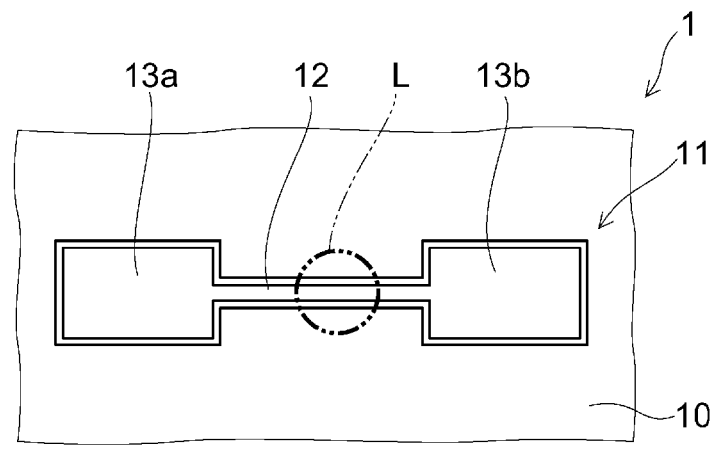
FIG. 2A is a plan view illustrating a laser light irradiation position of an example.
Figure 2B:
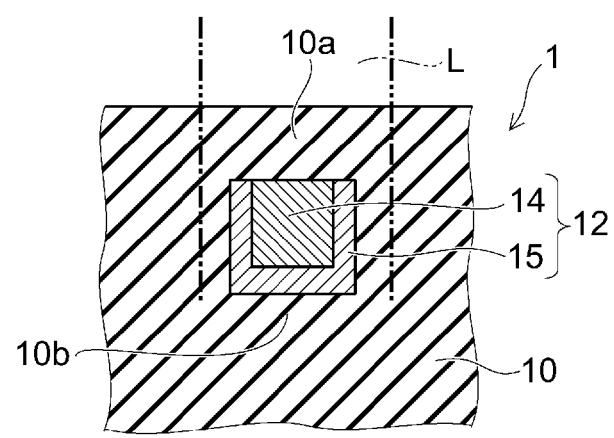
FIG. 2B is a sectional view thereof.

FIG. 2A is a plan view illustrating, for example, a laser light irradiation position and designated by the dashed line circle L. FIG. 2B is a sectional view of the cuttable portion 12 of the fuse 11, and FIG. 2C is a sectional view of the fuse showing a state thereof after the cuttable portion 12 of the fuse is cut.

Figure 2C:
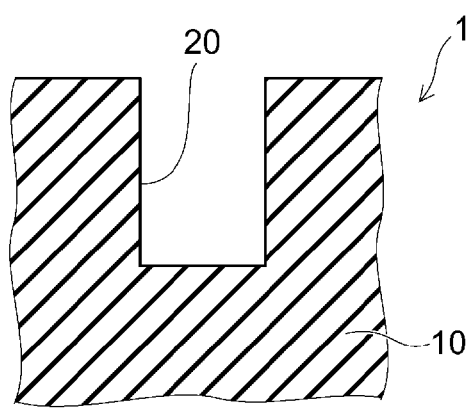
FIG. 2C is a sectional view showing a state after a fuse is cut.

FIG. 2A depicts the same view of the fuse 11 as that shown in FIG. 1A, and FIGS. 2B and 2C depict enlarged cross sections of the cuttable portion 12 of the fuse 11 of FIG. 1C.

As shown in FIGS. 2A and 2B, laser light L is shone onto (directed at) the cut portion 12 through an overlying interlayer dielectric 10 previously formed thereover. As a result, part of the laser light L passes through a portion located immediately above the cuttable portion 12 in the interlayer dielectric 10 (hereinafter referred to as an "upper-layer portion 10a") and is absorbed by the cuttable portion 12. At this time, the beam diameter of the laser light L is greater than the width of the cuttable portion 12 and is smaller than the length of the cuttable portion 12 in the direction of the length thereof. In an example, the beam diameter of the laser light L is 2 to 3 μm (micrometers), the width of the cuttable portion 12 is 0.6 μm, and the length of the cuttable portion 12 is 9.6 μm.

By setting the width of the cuttable portion 12 in the manner described above, even when the irradiation position of the laser light L fluctuates within a given range in the width direction of the cuttable portion 12, the whole of the cuttable portion 12 is located in the irradiation region of the laser light L, whereby the cuttable portion 12 can be cut reliably. Moreover, by setting the length of the cuttable portion 12 in the manner described above, even when the irradiation position of the laser light L fluctuates within a given range in the direction of the length of the cuttable portion 12, the laser light L is prevented from entering the terminal portions 13a and 13b, whereby the terminal portions 13a and 13b can be reliably prevented from suffering damage by the laser light L. Incidentally, making the cuttable portion 12 thinner or longer beyond the extent required based on the beam diameter of the laser light L and the margin of the irradiation position is not preferable because doing so increases the electrical resistance of the fuse 11 and the installation area required for positioning the fuse 11. On the other hand, the areas of the terminal portions 13a and 13b have to be increased to some extent to connect the vias 16a and 16b thereto, to ensure that the terminal portions 13a, 13b overly the underlying vias 16a, 16b within the limits of design and manufacturing positional tolerance.

As shown in FIGS. 2B and 2C, as a result of the laser light L entering the cuttable portion 12, a portion of the cuttable portion 12 irradiated with the laser light L is heated. At this time, since the cuttable portion 12 is covered with the upper-layer portion 10a of the interlayer dielectric 10, the heat is confined therein and the cuttable portion 12 is effectively heated. As a result, the cuttable portion 12 is heated to its evaporation temperature and the increased volume thereof in a vapor state causes the upper-layer portion 10a thereover to rupture and separate from the remainder of the overlying dielectric layer and release the metal vapor of the fuse, thereby creating a break, or opening, across the cuttable portion 12 of the fuse 11. As a result, the fuse 11 is cut, and a groove 20 is formed in the interlayer dielectric 10.

Moreover, a portion of the heat that flowed into the cuttable portion 12 by the laser light L, the portion that is not used for heating and evaporation of the cuttable portion 12 and the upper-layer portion 10a, flows into the terminal portions 13a and 13b from the cuttable portion 12 and is conducted away from the terminal portions 13a and 13b through the vias 16a and 16b and via portions that are in contact with the terminal portions 13a and 13b in the interlayer dielectric 10. Therefore, the amount of heat that flows into a portion in the interlayer dielectric 10, the portion that is in contact with the lower surface of the cuttable portion 12 (hereinafter referred to as a "base part 10b"), from the cuttable portion 12 is relatively small.

Next, the advantage of this embodiment will be described.

In this embodiment, since the cuttable portion 12 is made thinner than the terminal portions 13a and 13b, as compared to a case in which the cuttable portion 12 is made to have the same thickness as the thickness of the terminal portions 13a and 13b, the amount of heat required to heat and evaporate the cuttable portion 12 is small. Therefore, even when the output of the laser light L is reduced, the cuttable portion 12 can be cut reliably. As a result, the amount of heat that flows into the base part 10b of the interlayer dielectric 10 from the cuttable portion 12 is reduced, leading to little damage such as a crack to the surrounding dielectric, or "base part" 10b.

Moreover, since the terminal portions 13a and 13b are formed integrally with the cuttable portion 12, the resistance of a heat flow from the cuttable portion 12 to the terminal portions 13a and 13b is low. In addition, in this embodiment, since the total volume of the terminal portions 13a and 13b is set to be 20 or more times the volume of the cuttable portion 12, the heat capacity, i.e., the ability to function as a heat sink, of the terminal portions 13a and 13b is large. As a result, the terminal portions 13a and 13b function as a heat sink and easily absorb the heat of the cuttable portion 12. This also reduces the amount of heat that flows into the base part 10b and suppresses damage such as a crack to the base part 10b.

Incidentally, this embodiment deals with an example in which the vias 16a and 16b are located below the terminal portions 13a and 13b and the upper ends of the vias 16a and 16b are connected to the lower surfaces of the terminal portions 13a and 13b, respectively, but the embodiment is not limited to such an example. For example, the via may be located above the terminal portion and the lower end of the via may be connected to the upper surface of the terminal portion. Moreover, a conductive component connected to the terminal portion is not limited to a via, and, for example, as in a second embodiment which will be described below, a wiring line may be connected as a conductive component.

Next, a second embodiment will be described.

Figure 3A:
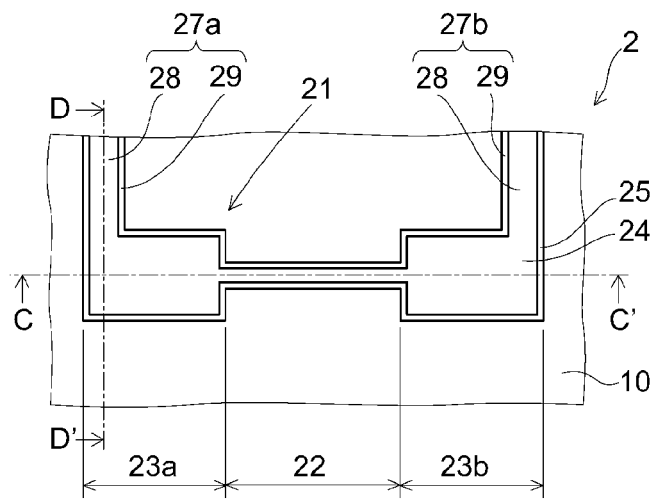
FIG. 3A is a plan view illustrating an integrated circuit device according to a second embodiment.
Figure 3B:
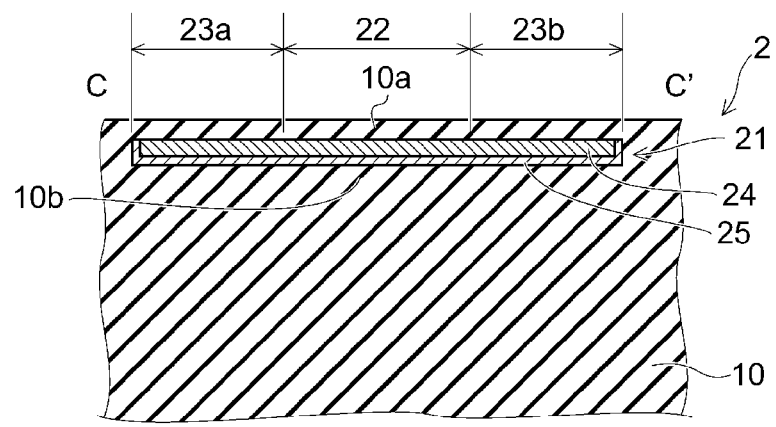
FIG. 3B is a sectional view taken on the line C-C' shown in FIG. 3A.

FIG. 3A is a plan view illustrating an integrated circuit device according to this embodiment byway of an example. FIG. 3B is a sectional view of FIG. 3A taken on the line C-C' shown in FIG. 3A, and FIG. 3C is a sectional view of FIG. 3A taken on the line D-D' shown in FIG. 3A.

Figure 3C:
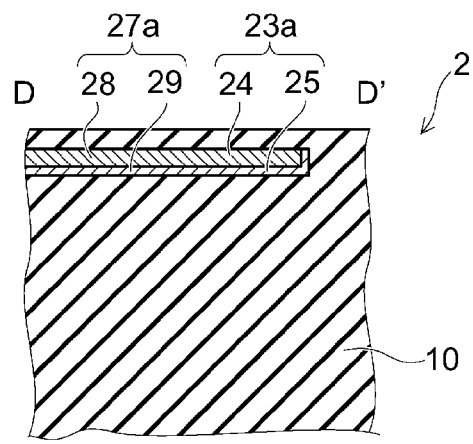
FIG. 3C is a sectional view taken on the line D-D' shown in FIG. 3A.

As shown in FIGS. 3A to 3C, an integrated circuit device 2 according to this embodiment differs from the integrated circuit device 1 (see FIGS. 1A to 1C) according to the first embodiment described earlier in that a fuse 21 has a uniform thickness, i.e., the terminal portions 23a and 23b and cuttable portion 22 thereof generally have the same thickness as measured in the depth direction of the surrounding dielectric material 10a, and terminal portions 23a and 23b of the fuse 21 are connected to wiring lines 27a, b, not vias.

In the integrated circuit device 2, an interlayer dielectric 10 is provided on a silicon substrate (not shown), and the fuse 21 is embedded in the interlayer dielectric 10. In the fuse 21, a cuttable portion 22 in the form of a wiring line and a pair of terminal portions 23a and 23b disposed on both sides of the cuttable portion 22 are integrally formed. The cuttable portion 22, the terminal portion 23a, and the terminal portion 23b have the shape of a substantially rectangular parallelepiped. The shape and the size of the terminal portion 23a are the same as the shape and the size of the terminal portion 23b.

Unlike the first embodiment described earlier, the cuttable portion 22 and the terminal portions 23a and 23b have the same thickness. On the other hand, as is the case with the first embodiment described earlier, the width of the terminal portions 23a and 23b is greater than the width of the cuttable portion 22. Moreover, the total volume of the terminal portions 23a and 23b is 20 or more times the volume of the cuttable portion 22.

Moreover, in the integrated circuit device 2, wiring lines 27a and 27b are provided and disposed in the same layer as the fuse 21. The wiring line 27a is connected to the terminal portion 23a, and the wiring line 27b is connected to the terminal portion 23b. As a result, the terminal portion 23a is connected to one node of a circuit (not shown) via the wiring line 27a, and the terminal portion 23b is connected to the other node of the circuit via the wiring line 27b.

The wiring lines 27a and 27b are formed integrally with the fuse 21. More specifically, the fuse 21 is formed of a main body portion 24 made of copper, for example, and a barrier metal layer 25 made of tungsten nitride, for example. The barrier metal layer 25 covers most of a side surface of the main body portion 24 and the whole of a bottom surface of the main body portion 24. On the other hand, the wiring lines 27a and 27b are each formed of a main body portion 28 made of copper, for example, and a barrier metal layer 29 made of tungsten nitride, for example. The barrier metal layer 29 covers most of a side surface of the main body portion 28 and the whole of a bottom surface of the main body portion 28.

In addition, the main body portion 24 of the fuse 21 and the main body portions 28 of the wiring lines 27a and 27b are integrally formed, and, between the main body portion 24 and the main body portions 28, the barrier metal layers 25 and 29 are not interposed. Incidentally, in the fuse 21, also between the cuttable portion 22 and the terminal portions 23a and 23b, the barrier metal layer 25 is not interposed. The operation of the integrated circuit device 2 according to this embodiment is the same as the operation of the first embodiment described earlier. That is, by irradiating the cuttable portion 22 of the fuse 21 with laser light, the cuttable portion 22 is heated and evaporated together with the upper-layer portion 10a of the interlayer dielectric 10. In this manner, the fuse 21 is cut. At this time, the heat that entered the cuttable portion 22 by the laser light flows into the terminal portions 23a and 23b from the cuttable portion 22 and is dispersed through the wiring lines 27a and 27b and the interlayer dielectric 10.

Next, the advantage of this embodiment will be described.

Also in this embodiment, as is the case with the first embodiment described earlier, since the terminal portions 23a and 23b are formed integrally with the cuttable portion 22 and the total volume of the terminal portions 23a and 23b is 20 or more times the volume of the cuttable portion 22, the terminal portions 23a and 23b function as a heat sink and the heat that entered the cuttable portion 22 can be efficiently discharged from the cuttable portion 22 and the surrounding dielectric 10a at the location of laser cutting of the fuse 2. As a result, the amount of heat that flows into the base part 10b of the interlayer dielectric 10 from the cuttable portion 22 can be reduced and damage such as a crack in the base part 10b can be suppressed.

Incidentally, if the thickness of a cuttable portion of a fuse is greater than the thickness of a terminal portion and the total volume of a pair of terminal portions is less than 20 times the volume of the cuttable portion, the amount of heat required to heat and evaporate the cuttable portion becomes large and the heat used to cut the cuttable portion is not effectively discharged into the terminal portion. As a result, the amount of heat that flows from the cuttable portion into a base part of an interlayer dielectric is increased, and a crack tends to appear in the base part (dielectric 10a). On the other hand, if the amount of heat that is applied to the cuttable portion is reduced to prevent the generation of a crack in the dielectric 10a, reliably cutting the fuse becomes a challenge. Therefore, an appropriate range of the amount of heat that can be used to cut the fuse while suppressing the generation of a crack in the adjacent dielectric material is narrowed and the output of the laser light is not easily fixed. In some cases, an appropriate range cannot be fixed, such that one laser light irradiation operation cannot reliably cut the fuse while suppressing the generation of a crack from fuse cutting to fuse cutting operation.

Next, a test example will be described.

In this test example, five samples having fuses with different shapes and sizes are produced, the fuses are cut by irradiation with laser light, and evaluations are made to determine whether or not a crack appeared in a base part of the adjacent interlayer dielectric. In the following description, a "volume ratio" refers to a value of the ratio of the total volume of a pair of terminal portions to the volume of a cuttable portion.

Example 1

Figure 4A:
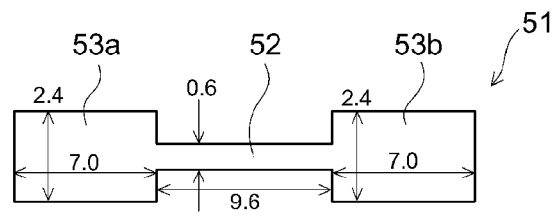
FIG. 4A is a plan view showing a fuse of Example 1.
Figure 4B:
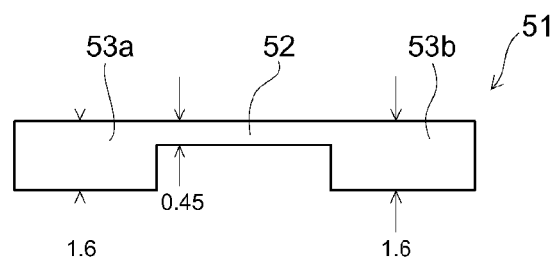
FIG. 4B is a sectional view in the direction of the length thereof.
Figure 4C:
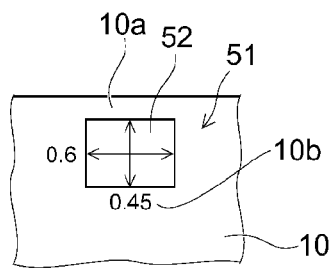
FIG. 4C is a sectional view of a cut portion thereof.
Figure 4D:
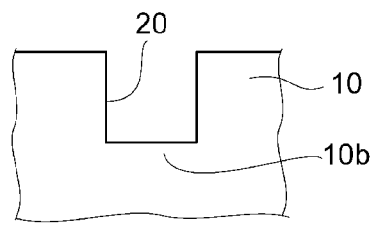
FIG. 4D is a sectional view showing an interlayer dielectric.

FIG. 4A is a plan view showing a fuse of Example 1. FIG. 4B is a sectional view of the fuse of FIG. 4A in the direction of the length thereof. FIG. 4C is a sectional view of the fuse of FIG. 4A showing the cuttable portion thereof, and FIG. 4D is a sectional view of the fuse of FIG. 4A showing the state of the interlayer dielectric after cutting of the fuse 1.

FIGS. 4A to 4C depict the same flat surface and cross sections as the flat surface and cross sections of FIGS. 1A to 1C and show a state before the fuse is cut or opened with a laser. Moreover, FIGS. 4A to 4C include specific dimensions of the individual parts of the fuse. The unit of these sizes is "μm". On the other hand, FIG. 4D depicts the same cross section as the cross section of FIG. 4C and shows a state after the fuse is cut. Furthermore, when the cuttable portion is thinner than the terminal portions, the description states "the thickness of the cuttable portion: thin"; when the thickness of the cuttable portion is the same as the thickness of the terminal portions, the description states "the thickness of the cuttable portion: same". The same paradigm applies to the other drawings which will be described later herein.

As shown in FIGS. 4A to 4C, since the thickness (dimension in a depth direction of the adjacent dielectric 10) of a cuttable portion 52 of a fuse 51 is 0.45 μm and the thickness of terminal portions 53a and 53b is 1.6 μm, the cuttable portion 52 is thinner than the terminal portions 53a and 53b. Moreover, since the volume of the cuttable portion 52 is 2.592 μm$^3$ (=0.6 μm×9.6 μm×0.45 μm) and the total volume of the terminal portions 53a and 53b is 53.76 μm$^3$ (=2.4 μm×7.0 μm×1.6 μm×2), the volume ratio is about 20.7 (=53.76 μm$^3$/2.592 μm$^3$). As shown in FIG. 4D, after the fuse 51 is cut by the laser light, a groove 20 is formed in an interlayer dielectric 10, but a crack did not appear in a base part 10b.

Example 2

Figure 5A:
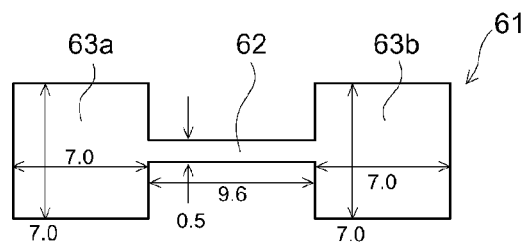
FIG. 5A is a plan view showing a fuse of Example 2.
Figure 5B:
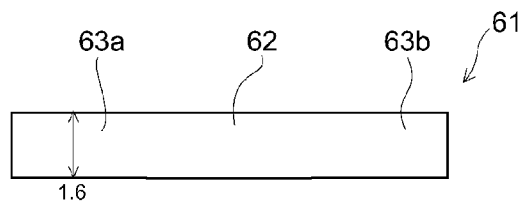
FIG. 5B is a sectional view in the direction of the length thereof.
Figure 5C:
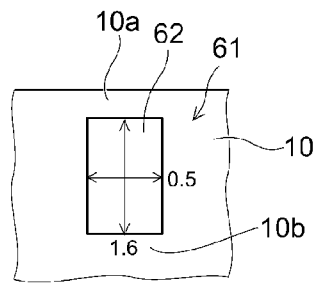
FIG. 5C is a sectional view of a cut portion thereof.
Figure 5D:
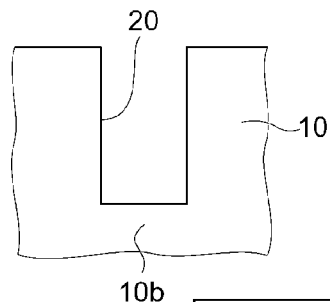
FIG. 5D is a sectional view showing an interlayer dielectric.

FIG. 5A is a plan view showing a fuse of Example 2. FIG. 5B is a sectional view of the fuse of FIG. 5A in the direction of the length thereof. FIG. 5C is a sectional view of the cuttable portion of the fuse of FIG. 5A, and FIG. 5D is a sectional view of the fuse of FIG. 5A showing the condition of an interlayer dielectric after cutting of the fuse of FIG. 5A.

As shown in FIGS. 5A to 5C, since the thickness of a cuttable portion 62 of a fuse 61 is 1.6 μm and the thickness of the terminal portions 63a and 63b is also 1.6 μm, the thickness of the cuttable portion 62 is the same as the thickness of the terminal portions 63a and 63b. Moreover, since the volume of the cuttable portion 62 is 7.68 we (=0.5 μm×9.6 μm×1.6 μm) and the total volume of the terminal portions 63a and 63b is 156.8 we (=7.0 μm×7.0 μm×1.6 μm×2), the volume ratio is about 20.4 (=156.8 μm$^3$/7.68 μm$^3$). As shown in FIG. 5D, after the fuse 61 is cuttable by the laser light, a groove 20 is formed in an interlayer dielectric 10, but a crack did not appear in a base part 10b.

Example 3

Figure 6A:
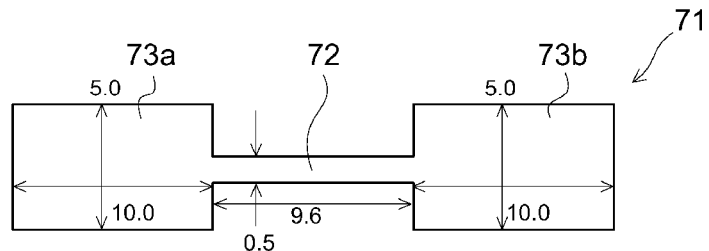
FIG. 6A is a plan view showing a fuse of Example 3.
Figure 6B:
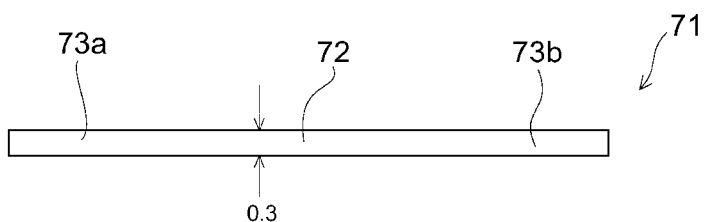
FIG. 6B is a sectional view in the direction of the length thereof.
Figure 6C:
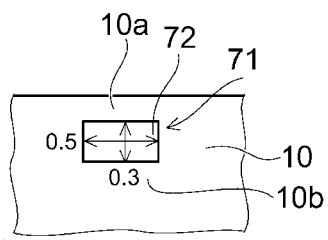
FIG. 6C is a sectional view of a cut portion thereof.
Figure 6D:
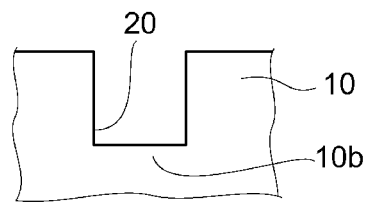
FIG. 6D is a sectional view showing an interlayer dielectric.

FIG. 6A is a plan view showing a fuse of Example 3. FIG. 6B is a sectional view of the fuse of FIG. 6A in the direction of the length thereof. FIG. 6C is a sectional view of a cuttable portion of the fuse of FIG. 6A, and FIG. 6D is a sectional view of the fuse of FIG. 6A showing the condition of an interlayer dielectric after cutting of the fuse of FIG. 6A.

As shown in FIGS. 6A to 6C, since the thickness of a cuttable portion 72 of a fuse 71 is 0.3 μm and the thickness of terminal portions 73a and 73b is also 0.3 μm, the thickness of the cuttable portion 72 is the same as the thickness of the terminal portions 73a and 73b. Moreover, since the volume of the cuttable portion 72 is 1.44 μm$^3$ (=0.5 μm×9.6 μm×0.3 μm) and the total volume of the terminal portions 73a and 73b is 30 μm$^3$ (=5.0 μm×10.0 μm×0.3 μm×2), the volume ratio is about 20.8 (=30 μm$^3$/1.44 μm$^3$). As shown in FIG. 6D, after the fuse 71 is cuttable by the laser light, a groove 20 is formed in an interlayer dielectric 10, but a crack did not appear in a base part 10b.

Comparative Example 1

Figure 7A:
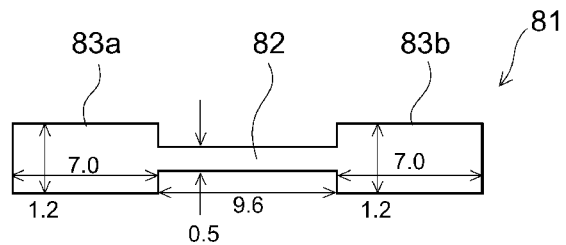
FIG. 7A is a plan view showing a fuse of Comparative Example 1.
Figure 7B:
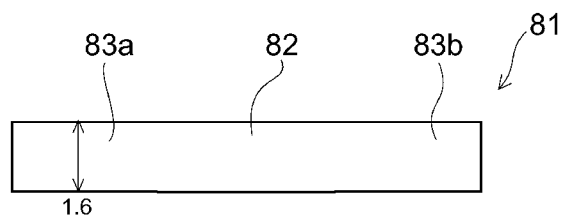
FIG. 7B is a sectional view in the direction of the length thereof.
Figure 7C:
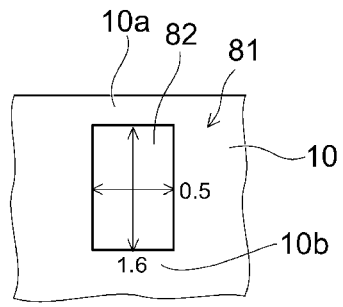
FIG. 7C is a sectional view of a cut portion thereof.
Figure 7D:
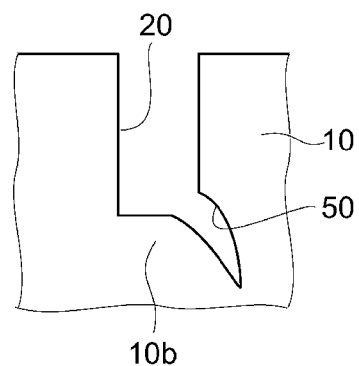
FIG. 7D is a sectional view showing an interlayer dielectric.

FIG. 7A is a plan view showing a fuse of Comparative Example 1. FIG. 7B is a sectional view in the direction of the length of the fuse of FIG. 7A. FIG. 7C is a sectional view of a cuttable portion of the fuse of FIG. 7A, and FIG. 7D is a sectional view showing the condition of an interlayer dielectric of the fuse of FIG. 7A after cutting thereof.

As shown in FIGS. 7A to 7C, since the thickness of a cuttable portion 82 of a fuse 81 is 1.6 μm and the thickness of terminal portions 83a and 83b is also 1.6 μm, the thickness of the cuttable portion 82 is the same as the thickness of the terminal portions 83a and 83b. Moreover, since the volume of the cuttable portion 82 is 7.68 μm$^3$ (=0.5 μm×9.6 μm×1.6 μm) and the total volume of the terminal portions 83a and 83b is 26.88 μm$^3$ (=1.2 μm×7.0 μm×1.6 μm×2), the volume ratio is 3.5 (=26.88 μm$^3$/7.68 μm). As shown in FIG. 7D, after the fuse 81 is cuttable by the laser light, a groove 20 is formed in an interlayer dielectric 10 and a crack 50 appeared in a base part 10b near a bottom surface of the groove 20.

Comparative Example 2

Figure 8A:
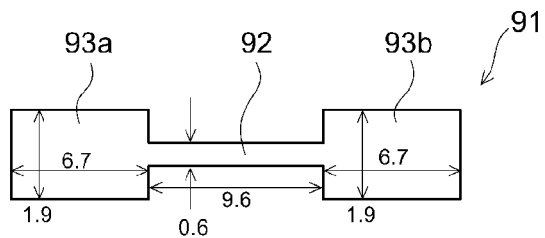
FIG. 8A is a plan view showing a fuse of Comparative Example 2.
Figure 8B:
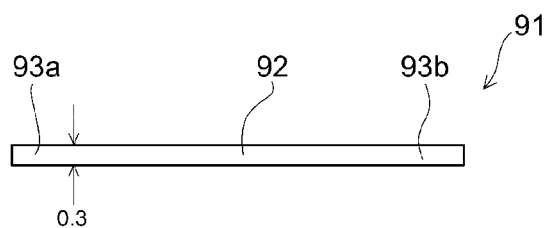
FIG. 8B is a sectional view in the direction of the length thereof.
Figure 8C:
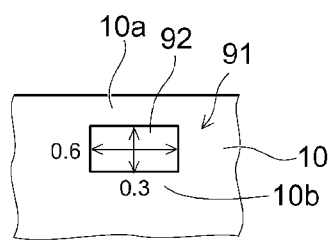
FIG. 8C is a sectional view of a cut portion thereof.
Figure 8D:
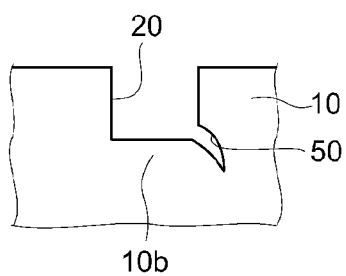
FIG. 8D is a sectional view showing an interlayer dielectric.

FIG. 8A is a plan view showing a fuse of Comparative Example 2. FIG. 8B is a sectional view in the direction of the length of the fuse of FIG. 8A. FIG. 8C is a sectional view of a cuttable portion of the fuse of FIG. 8A, and FIG. 8D is a sectional view showing the condition of an interlayer dielectric of the fuse of FIG. 8A after cutting thereof.

As shown in FIGS. 8A to 8C, since the thickness of a cuttable portion 92 of a fuse 91 is 0.3 μm and the thickness of terminal portions 93a and 93b is also 0.3 μm, the thickness of the cuttable portion 92 is the same as the thickness of the terminal portions 93a and 93b. Moreover, since the volume of the cuttable portion 92 is 1.728 μm$^3$ (=0.6 μm×9.6 μm×0.3 μm) and the total volume of the terminal portions 93a and 93b is 7.638 μm$^3$ (=1.9 μm×6.7 μm×0.3 μm×2), the volume ratio is about 4.4 (=7.638 μm$^3$/1.728 μm$^3$). As shown in FIG. 8D, after the fuse 91 is cut by the laser light, a groove 20 is formed in an interlayer dielectric 10 and a crack 50 appeared in a base part 10b near a bottom surface of the groove 20.

The results of the test example described above are shown in Table 1.

As shown in Table 1, in Example 1 in which the cuttable portion is thinner than the terminal portions and the volume ratio is 20 or more and Example 2 and Example 3 in which the volume ratio is 20 or more, after the fuse is cuttable, a crack did not appear in the base part 10b of the interlayer dielectric 10. On the other hand, in Comparative Example 1 and Comparative Example 2 in which the thickness of the cuttable portion is the same as the thickness of the terminal portions and the volume ratio is less than 20, the crack 50 appeared in the base part 10b.

TABLE 1

|  | Thickness of cuttable portion | Volume ratio | Crack |
|---|---|---|---|
| Example 1 | thin | 20.7 | none |
| Example 2 | same | 20.4 | none |
| Example 3 | same | 20.8 | none |
| Comparative Example 1 | same | 3.5 | present |
| Comparative Example 2 | same | 4.4 | present |

According to the embodiments described above, an integrated circuit device in which little damage to a base is caused when a fuse is cuttable by being irradiated with laser light can be implemented.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Moreover, the embodiments described above may be combined and embodied.

What is claimed is:

1. An integrated circuit device comprising:
   an interconnection circuit having a first and a second conductor; and
   a fuse extending between, and selectively electrically interconnecting the first and second conductor, wherein the fuse includes
      a first terminal portion in electrical and physical contact with the first conductor;
      a second terminal portion in electrical and physical contact with the second conductor; and
      a cuttable portion extending between the first terminal portion and the second terminal portion,
   wherein the volume of the cuttable portion is at least 20 times smaller than the total volume of the first terminal portion and the second terminal portion.

2. The integrated circuit device of claim 1, wherein the cuttable portion, the first terminal portion and the second terminal portion are formed of a continuous conductive material capable of laser ablation thereof.

3. The integrated circuit device of claim 1, wherein the cuttable portion, first terminal portion and second terminal portion are embedded in a dielectric material.

4. The integrated circuit device of claim 3, wherein a barrier layer is positioned between the cuttable portion, the first terminal portion and the second terminal portion, and the dielectric material.

5. The integrated circuit device of claim 4, wherein the barrier layer does not cover an upper surface of the cuttable portion.

6. The integrated circuit device of claim 1, wherein the cuttable portion, the first terminal portion, the second terminal portion and the first conductor and the second conductor are formed of a continuous conductive material.

7. The integrated circuit device of claim 1, further including an intermediate material disposed between at least the first conductor and the first terminal portion.

8. The integrated circuit device of claim 1, wherein at least one of the first and second conductors is a via extending to a wiring layer in the integrated circuit.

9. The integrated circuit device of claim 8, wherein the vias, the terminal portions and the cuttable portion are formed as a dual damascene structure.

10. The integrated circuit device of claim 1, wherein the distance between the first terminal portion and second terminal portion spanned by the cuttable portion is greater than the size of a laser spot useful to evaporate the material of the cuttable portion.

11. The integrated circuit device of claim 1, wherein the cuttable portion is thinner than the terminal portions.

12. The integrated circuit device of claim 1, wherein the width of the terminal portions is greater than the width of the cuttable portion.

13. An integrated circuit device comprising
   a fuse having a pair of terminal portions, the terminal portions are provided on both sides of a cuttable portion that is cut as needed by being irradiated with laser light, the cuttable portion and the pair of terminal portions being integrally formed, wherein
   the width of the terminal portions is greater than the width of the cuttable portion, and
   the total volume of the pair of terminal portions is 20 or more times greater than the volume of the cuttable portion.

14. The integrated circuit device according to claim 13, wherein the cuttable portion is thinner than the terminal portions.

15. The integrated circuit device according to claim 13, wherein the cuttable portion and the terminal portions have the same thickness.

16. The integrated circuit device according to claim 13, further comprising a wiring line connected to the terminal portion, and the wiring line and the fuse being integrally formed.

17. The integrated circuit device of claim 16, wherein the wiring line and the fuse are formed of a continuous conductive material.

18. The integrated circuit device according to claim 13, wherein the fuse includes a main body layer made of copper and a barrier metal layer covering a lower surface and a side surface of the main body layer.

19. The integrated circuit device according to claim 18, wherein
   the barrier metal layer does not cover an upper surface of the cuttable portion.

* * * * *